United States Patent
Shaw et al.

(10) Patent No.: US 9,484,067 B2
(45) Date of Patent: Nov. 1, 2016

(54) CIRCUIT HAVING CAPACITOR COUPLED WITH MEMORY ELEMENT

(71) Applicant: TAIWAN SEMICONDUCTOR MANUFACTURING COMPANY, LTD., Hsinchu (TW)

(72) Inventors: Ching-Hao Shaw, San Jose, CA (US); Subramani Kengeri, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/446,501

(22) Filed: Jul. 30, 2014

(65) Prior Publication Data

US 2014/0339618 A1    Nov. 20, 2014

Related U.S. Application Data

(62) Division of application No. 12/751,542, filed on Mar. 31, 2010, now Pat. No. 8,824,226.

(60) Provisional application No. 61/166,240, filed on Apr. 2, 2009.

(51) Int. Cl.
| | |
|---|---|
| *G11C 29/52* | (2006.01) |
| *G11C 5/00* | (2006.01) |
| *G11C 11/412* | (2006.01) |
| *H01L 23/522* | (2006.01) |
| *H01L 27/10* | (2006.01) |
| *H01L 27/105* | (2006.01) |
| *H01L 49/02* | (2006.01) |
| *G11C 11/417* | (2006.01) |
| *H01L 23/556* | (2006.01) |
| *H01L 27/06* | (2006.01) |
| *H01L 27/11* | (2006.01) |

(52) U.S. Cl.
CPC .............. *G11C 5/005* (2013.01); *G11C 11/417* (2013.01); *G11C 11/4125* (2013.01); *G11C 29/52* (2013.01); *H01L 23/5223* (2013.01); *H01L 23/556* (2013.01); *H01L 27/0629* (2013.01); *H01L 27/101* (2013.01); *H01L 27/105* (2013.01); *H01L 27/1104* (2013.01); *H01L 28/40* (2013.01); *H01L 28/60* (2013.01); *H01L 2924/0002* (2013.01); *Y10T 29/43* (2015.01)

(58) Field of Classification Search
CPC .................. G11C 5/005; G11C 11/41–11/419
See application file for complete search history.

(56) References Cited

U.S. PATENT DOCUMENTS

| | | | |
|---|---|---|---|
| 5,204,990 A * | 4/1993 | Blake | G11C 5/005 257/300 |
| 6,211,692 B1 | 4/2001 | Shadbe et al. | |

(Continued)

*Primary Examiner* — Harry W Byrne
*Assistant Examiner* — R Lance Reidlinger
(74) *Attorney, Agent, or Firm* — Hauptman Ham, LLP

(57) ABSTRACT

A circuit includes a capacitor and a memory element. The capacitor includes a first conductive layer, a first terminal, and a second terminal. The first conductive layer includes a first plurality of bars extending along a first direction and parallel to one another, where two adjacent bars of the first plurality of bars have a first capacitance therebetween. The first terminal is coupled with a first bar of the two adjacent bars, and the second terminal is coupled with a second bar of the two adjacent bars. The memory element has an input coupled with the first terminal and an output coupled with the second terminal. The capacitor is configured to inhibit changing a logic state at the input of the memory element.

20 Claims, 6 Drawing Sheets

(56) References Cited

U.S. PATENT DOCUMENTS

| | | |
|---|---|---|
| 6,624,677 B1 | 9/2003 | Wissel |
| 6,876,572 B2 * | 4/2005 | Turner ............... G11C 11/4125 365/154 |
| 7,033,883 B2 * | 4/2006 | Huang ............... H01L 27/0811 257/E27.05 |
| 7,213,410 B2 | 5/2007 | Lipp et al. |
| 2004/0043554 A1 | 3/2004 | Wang et al. |
| 2004/0233701 A1 | 11/2004 | Turner |

\* cited by examiner

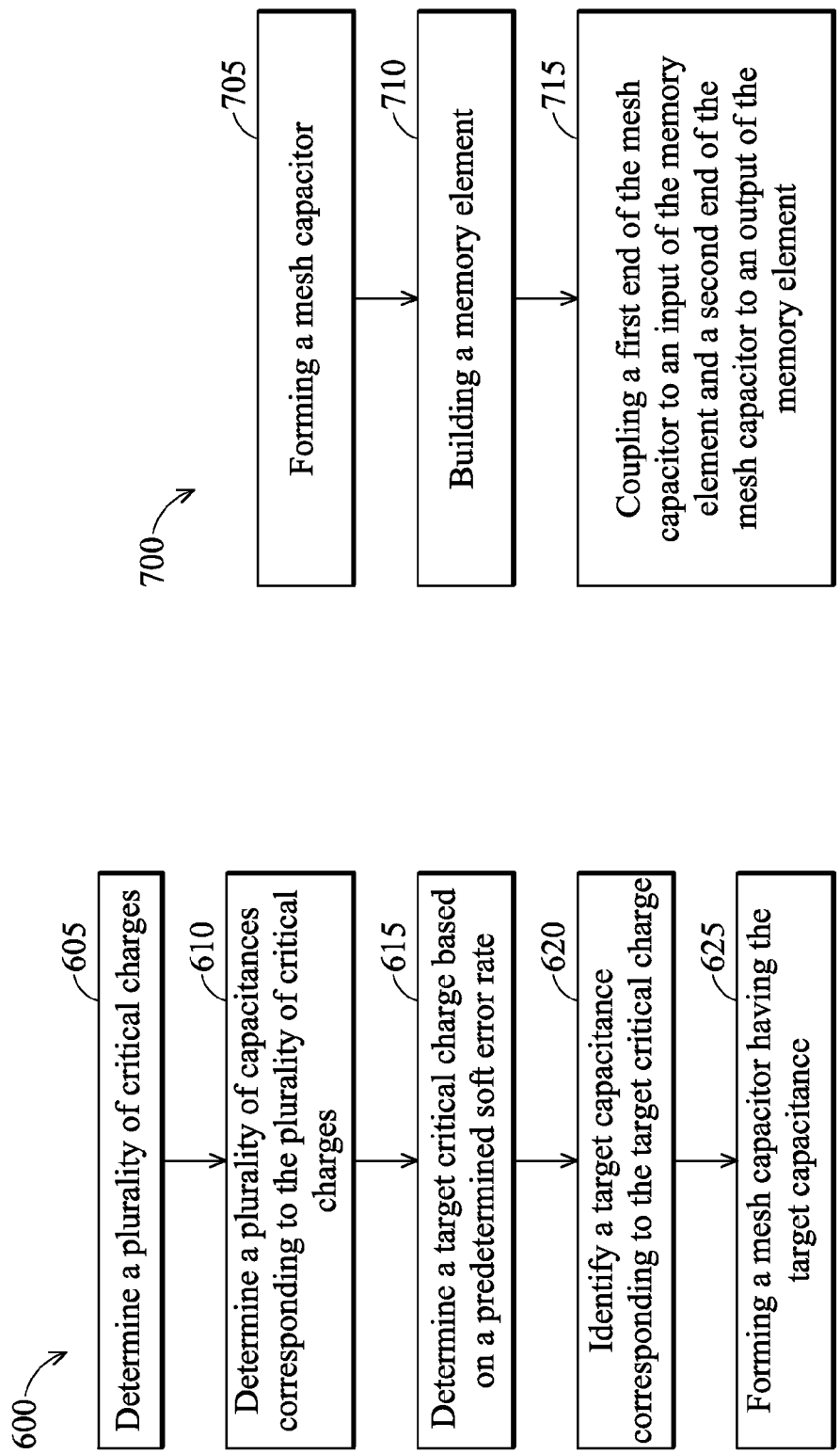

CIRCUIT HAVING CAPACITOR COUPLED WITH MEMORY ELEMENT

PRIORITY CLAIM

The present application is a divisional of U.S. application Ser. No. 12/751,542, filed Mar. 31, 2010, now U.S. Pat. No. 8,824,226, which claims priority of U.S. Provisional Application No. 61/166,240, filed Apr. 2, 2009, which are incorporated herein by reference in their entireties.

TECHNICAL FIELD

The present disclosure is related to a circuit having a capacitor coupled with a memory element including, for example, flip-flops, latches, clock-gated latches, etc.

BACKGROUND

Soft errors are usually the results of radiation from alpha particles from semiconductor packages and neutrons from the environment. A soft error changes data (e.g., the states in a storage node), but does not change the physical circuit itself. If the data is rewritten, the circuit works again. Soft error rate (SER) is the failure rate at which a device (or system) encounters or is predicted to encounter soft errors. SER is typically expressed in FIT (failures in time). The unit adopted for quantifying FIT is also called FIT, which refers to 1 error per billion hours of device operation. Logic SER shows an increasing trend with technology scaling.

Radiation hardening refers to making memory elements resistant to damage or malfunctions caused by radiation, e.g., from neutrons and alpha particles, etc. For example, in a flip-flop, radiation hardening enables the flip-flop to experience fewer changes to its state (e.g., flip the data). In advanced semiconductor process technologies, storage nodes, including those of SRAM and flip-flops, are more susceptible to single event upsets (SEUS) from radiation. Error detection and correction (ECC) circuits to improve radiation hardening usually require complex and elaborate implementations, and therefore also require large circuit areas in a semiconductor chip. Additionally, some correction circuits require complicated system feedback and controls (e.g., circuitry to provide correction information through a feedback loop to replace erroneous information).

Various approaches use feedback or redundant circuits for correcting storage nodes due to radiation, but they require circuits (e.g., transistors) being modified and/or added to existing correction circuits and flip-flops, which are also susceptible to SER due to radiation.

Other approaches add gate capacitors to improve the ability to sustain charge injection into the storage nodes by increasing critical charge (e.g., $Q_c$), which helps improving SER FIT. Gate capacitors, however, are also susceptible to radiation because they include active gate regions, which are proportionally related to SER. Additionally, gate capacitors cannot be used across the input and output of the memory elements (e.g., flip-flops) because a gate capacitor requires a power or ground node.

BRIEF DESCRIPTION OF THE DRAWINGS

The details of one or more embodiments are set forth in the accompanying drawings and the description below. Other features and advantages will be apparent from the description, drawings, and claims.

FIG. 6 is a flowchart illustrating a method for forming a mesh capacitor, in accordance with some embodiments.

FIG. 7 is a flowchart illustrating a method for improving radiation hardening and thus improving SER of a memory element, in accordance some embodiments.

Like reference symbols in the various drawings indicate like elements.

DETAILED DESCRIPTION

Figure 1:
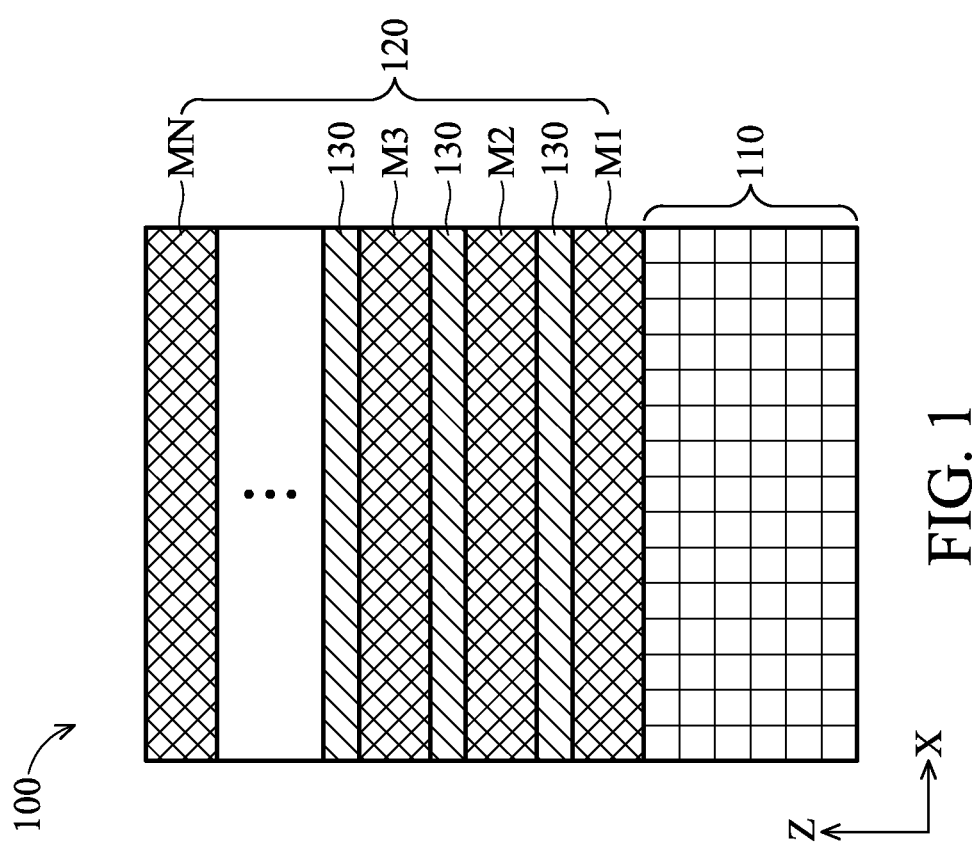
FIG. 1 is a diagram of a cross section of a semiconductor structure being used in some embodiments.

Some embodiments are related to a mesh capacitor, which improves the SER FIT rate. In some embodiments, the mesh capacitor is connected between the input and the output of a latch in a flip-flop, enabling the flip-flop harder to flip due to radiation (e.g., from neutrons and/or alpha particles). In some embodiments, the capacitor is built directly vertically on top of the flip-flop, saving chip layout space.

Some embodiments have one or a combination of the following features and/or advantages. Some embodiments improve the SER FIT rate up to 100 times or more when required. Capacitance in accordance with some embodiments is sized for various SER FIT rate requirements to meet specific applications. Because the mesh capacitors in some embodiments are passive, the dielectric material among metals creates less electron-hole pairs than gate capacitors do. Therefore, the mesh capacitors are more robust, e.g., improve radiation hardening. Further, because the mesh capacitors are built on top of the storage elements (e.g., the flip-flops) using upper metal layers when appropriate, chip areas are saved (while gate capacitors in other approaches cannot be built on top of a device and thus still require independent layout areas). In some embodiments, no error correction or feedback circuitry is required for circuit error correction, and the embodiments are used with various flip-flops and/or latches with storage nodes.

Embodiments, or examples, illustrated in the drawings are now being described using specific languages. It will nevertheless be understood that the embodiments and examples are not intended to be limiting. Any alterations and modifications in the disclosed embodiments, and any further applications of principles disclosed in this document are contemplated as would normally occur to one of ordinary skill in the pertinent art. Reference numbers may be repeated throughout the embodiments, but this does not necessarily require that feature(s) of one embodiment apply to another embodiment, even if they share the same reference number.

The Semiconductor Device Structure

FIG. 1 is a diagram of a cross section of a semiconductor device structure 100 being used in some embodiments. Structure 100 is shown in the X-axis and Z-axis directions while the Y-axis direction is into the paper, and includes a base layer 110 and an interconnect layer 120.

Generally, base layer 110 includes a semiconductor substrate that, in turn, includes poly regions, diffusion regions, semiconductor wells (e.g., N-wells, P-wells, deep N-wells, deep P-wells), etc., wherein semiconductor devices (e.g., transistors, diodes, etc.) are formed. Interconnect layer 120 includes N (e.g., an integer number of) conductive layers (e.g., metal layers M1 to MN) used for interconnecting devices within layers in interconnect layer 120 and for forming electrical connections to external devices, etc. Interconnect layer 120 generally includes vias, inter-level dielectric materials, passivation layers, bonding pads, packaging resources, etc. Each metal (e.g., conductive) layer M in interconnect layer 120 is commonly called metal one, metal two, metal three (M1, M2, M3, etc) layers, etc. Between the various metal layers M are dielectric materials (e.g., high-K, low-K material, etc.) 130 used to insulate the metal layers M. Base layer 110 and interconnect layer 120 are called a front-end structure and a backend structure, respectively, because they are the respective "front end of line—FEOL" and "back end of line—BEOL," in the semiconductor fabrication process. In some embodiments, memory or storage elements including latches and flip-flops are built using base layer 110 and one or a plurality of metal layers M.

The Capacitor

Figure 2:
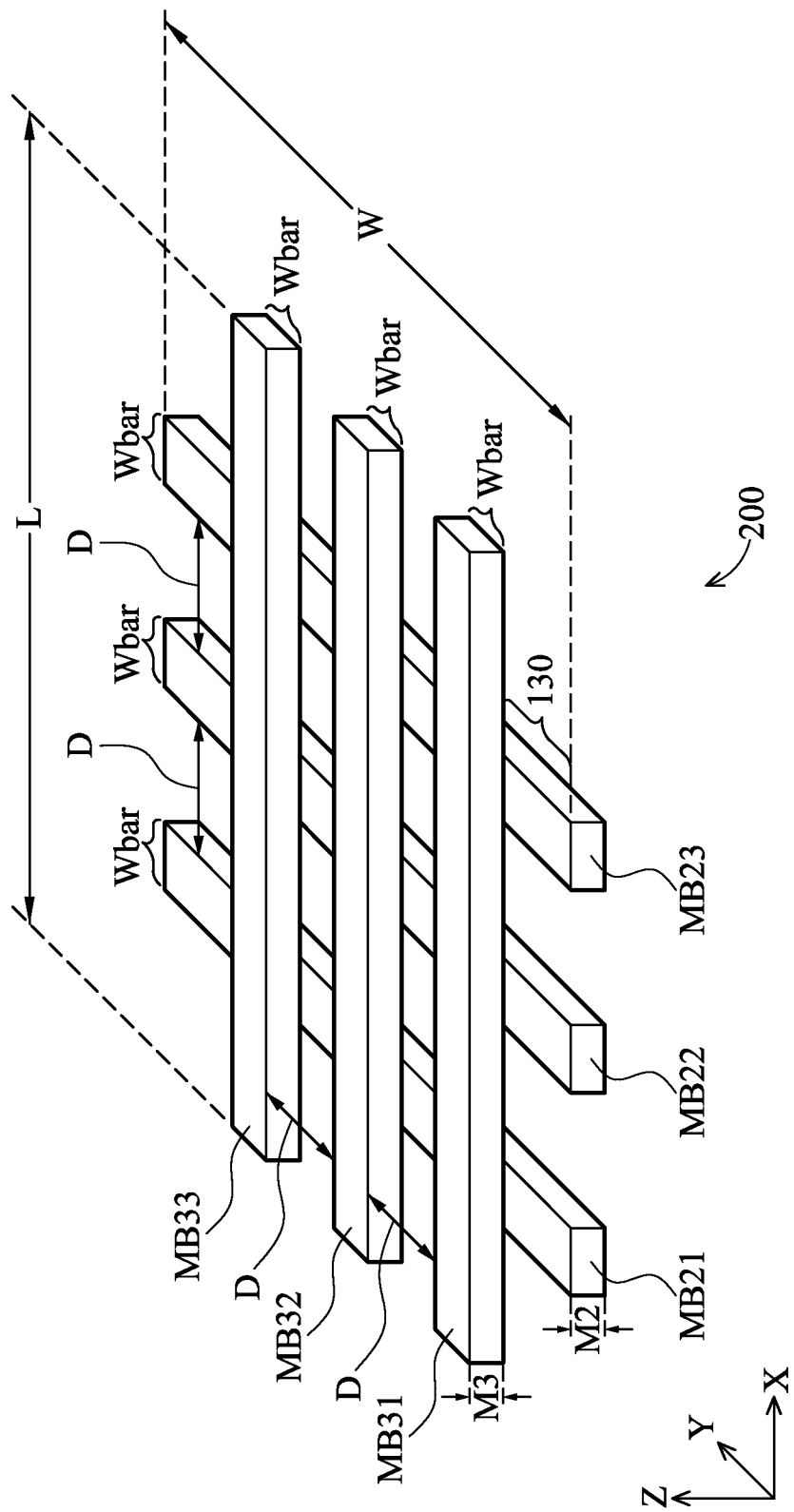
FIG. 2 is a diagram of a capacitor in accordance with some embodiments.
Figure 3:
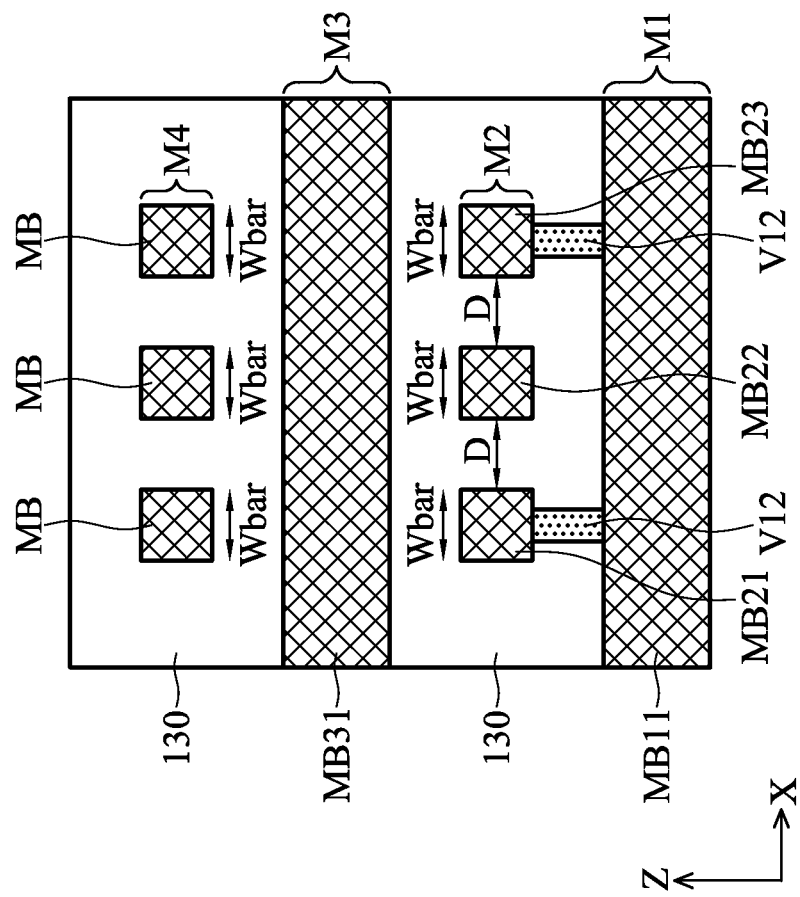
FIG. 3 is a diagram of a cross section of the capacitor in FIG. 2, in accordance with some embodiments.

FIG. 2 is a diagram of a capacitor 200 in three dimensions (e.g., X, Y, and Z), in accordance with some embodiments. Capacitor 200 is called a "mesh" capacitor and includes a plurality of conductive layers M (e.g., M1, M2, M3, etc.), but, for simplicity, FIG. 2 shows capacitor 200 having only two layers (e.g., M2 and M3) while FIG. 3 shows a cross-section view of capacitor 200 having four layers (e.g., M1, M2, M3, and M4). The number of layers shown in FIGS. 2 and 3 are for illustration, capacitors with different numbers of layers, e.g., from 1 to N layers, are within the scope of the disclosed embodiments. N is a positive integer number. Each metal layer M includes a plurality of metal bars MB (e.g., MB21, MB22, and MB23 in layer M2 and MB31, MB32, MB33 in layer M3 in FIG. 2), each being parallel (substantially parallel) to one another. For further illustration purposes, FIGS. 2 and 3 show three metal bars MB in each layer M2, M3 and M4, but configurations having different numbers of metal bars MB per metal layer M are within the scope of the disclosed embodiments. In some embodiments, a first set of metal bars MB (e.g., metal bars MB in metal layers M1, M3, M5, etc.) run in a first direction (e.g., X-axis direction) while a second set of metal bars MB (e.g., in metal layers M2, M4, M6, etc.) run in a second direction (e.g., Y-axis direction) wherein the X-axis direction is perpendicular to the Y-axis direction. Different configurations wherein all bars MB run in one direction (e.g., X-axis direction, Y-axis direction, or any other convenient direction) or a combination of directions are within the scope of the disclosed embodiments. In FIG. 3, the Y-axis direction is into the paper. Each metal bar MB include a width $W_{bar}$. In some embodiments, all widths $W_{bar}$ are of the same dimension, but the disclosed embodiments are not limited to such a configuration. Depending on design choices, widths $W_{bar}$ may be of different dimensions (e.g., one width $W_{bar}$ may be shorter/larger than another one). Two adjacent metal bars MB are spaced or separated by a distance, e.g., distance D. In some embodiments, distances D are selected to meet the minimum requirements of spacing between two metal bars MB to form capacitance between those two bars. In some embodiments, all distances D in capacitor 200 are of the same dimension, but the disclosed embodiments are not limited to such a configuration. That is, distances D may be of different dimensions (e.g., one distance D may be shorter/longer than another one). Thickness of a metal bar MB in a layer M takes the thickness of that layer M, which is process technology dependent and different groups of layers M have different thicknesses. For example, a first group of metal layers M (e.g., Mx) has a first thickness, a second group of metal layer M (e.g., My) has a second thickness, and a third group of metal layers (e.g., Mz) has a third thickness, etc, wherein the first, the second, and the third thickness are of different sizes. For illustration, capacitor 200 is formed having a width W and a length L.

Metal layers M are separated by dielectric material 130. In some embodiments, the dielectric material 130 creates less electron-hole pairs than gate capacitors used in other approaches and some embodiments are therefore more robust. That is, the embodiments enable the devices using capacitor 200 to sustain higher radiation and less opportunity for the flip-flop to unwantedly flip its state.

In some embodiments, capacitors (e.g., capacitors $C_B$) are formed between two adjacent metal bars MB in each metal layer M. In some embodiments, alternating bars in a metal layer M are connected together and a first terminal is formed therefrom. Similarly, the other alternating bars are connected together and a second terminal is formed therefrom. In some embodiments, one metal layer M is used to form a capacitor, and the first terminal and the second terminal serve as the terminals for that capacitor. Capacitors are also formed between two adjacent metal layers (e.g., between layers M1 and M2, M2 and M3, M3 and M4, etc.) and are called capacitors $C_M$. In some embodiments, capacitors $C_M$, however, are insignificant compared to capacitors $C_B$ and are therefore disregarded in the calculation of the total capacitance C for capacitor 200. In some embodiments, widths $W_{bar}$ insignificantly affect capacitance $C_M$ and are therefore also discarded in the total calculation of capacitance C. In those situations, the total capacitance C of capacitor 200 is the sum of capacitance of all capacitors $C_B$ formed for a particular configuration of capacitor 200 (e.g., the capacitor is formed based on the number of layers M, the number of metal bars MB in each layer M, etc.).

In some embodiments, the total capacitance C of capacitor 200 varies depending on various factors, including, for example, the number of metal layers M (e.g., layers M1, M2, . . . , MN), the number of metal bars MB per layer, the distance D between adjacent metal bars MB, the unit charge per length of each metal bar MB, the layout geometry (e.g., the area defined by width W and length L in FIG. 2), etc. In some embodiments, the desired capacitance C for an application is determined and one or a combination of the above factors (e.g., the number of metal layers M, distance D, width W and/or length L) is adjusted to obtain capacitor 200 having the desired capacitance C.

In some embodiments, the capacitance of capacitors $C_B$ depends on one or a combination of the unit charge per unit length of the corresponding metal bars MB, the distance D between two adjacent metal bars. Generally, the longer the metal bars MB, the larger the capacitance of a capacitor $C_B$, and the shorter the metal bars MB, the smaller the capacitance of a capacitor $C_B$. Additionally, the longer the distance D, the small the capacitance for a capacitor $C_B$, and the shorter the distance D, the larger the capacitance a capacitor $C_B$. In some embodiments, the capacitance for capacitors $C_B$ is determined based on Simulation Program with Integrated Circuit Emphasis (SPICE) data, which takes account of capacitance per unit length of metal bars MB, the spacing distance D, etc. For example, SPICE documents provide look up tables indicating the capacitance of a capacitor $C_B$ based on the spacing distance D and/or material used for each metal bar MB that can affect the unit charge per unit length, etc.

Since capacitors $C_B$ are formed by adjacent metal bars MB, adding additional metal bars MB in each metal layer M adds additional capacitance for capacitor 200. Conversely, reducing capacitance C of capacitor 200 may be acquired by reducing the number of metal bars MB in each metal layer M. Because in a given area the number of metal bars MB are affected by distance D, width W and/or length L, capacitance C is adjusted by increasing or decreasing distance D, width W, length L, or a combination thereof. For example, if length L is shorter, the capacitance of capacitors $C_B$ in layers M1 and M3 is reduced. Conversely, if L length is longer the capacitance of capacitors $C_B$ in layers M1 and M3 increases. Similarly, if width D is shorter, the capacitance of capacitors $C_B$ in layers M2 and M4 is reduced. Conversely, if width D is longer the capacitance of capacitors $C_B$ in layers M2 and M4 increases. Further, since each metal layer M includes a plurality of capacitors $C_B$, adding additional layers M adds additional capacitance for capacitor 200. Conversely, reducing capacitance C of capacitor 200 may be acquired by reducing the number of metal layers M by removing/deactivating one or more layers M.

Figure 4:
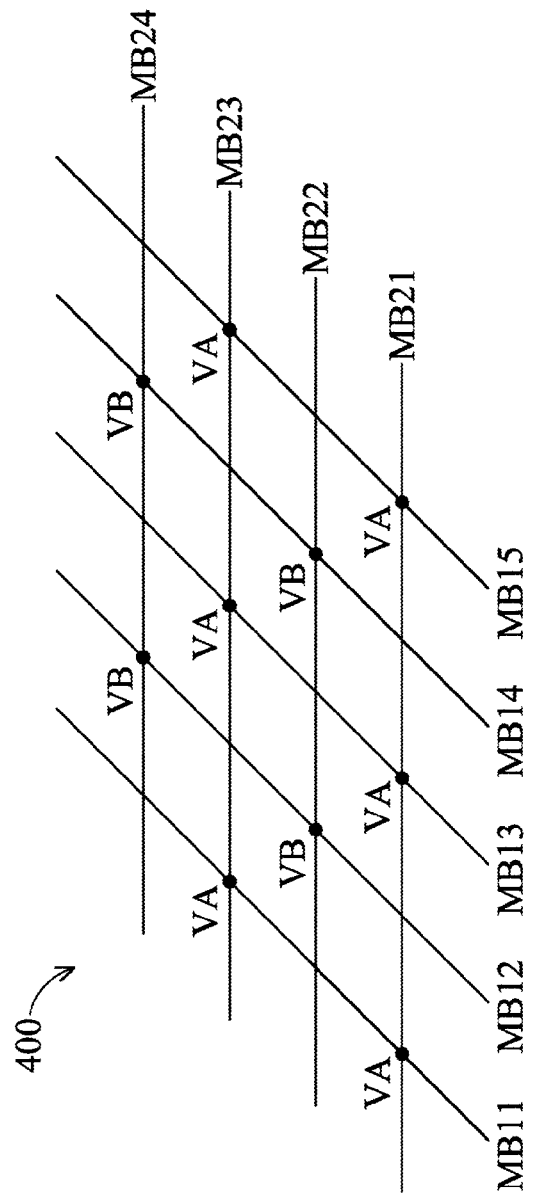
FIG. 4 is an image illustrating how vias can be used to connect metal bars, in accordance with some embodiments.

In some embodiments, a metal bar MB in a metal layer (e.g., M2) is connected to another metal bar in an adjacent metal layer (e.g., M1 or M3) using a via. For illustration, FIG. 3 shows two vias V12 connecting a metal bar MB11 to two metal bars MB21 and MB22, respectively. Additional vias can be provided to connect the various metal bars MB in different metal layers in FIG. 3. FIG. 4 shows an image 400 illustrating different vias V (e.g., vias VA and VB) connecting exemplary metal bars MB11, MB12, MB13, MB14, and MB15 of exemplary metal layer M1 to exemplary metal bars MB21, MB22, MB23 and MB24 of exemplary metal layer M3. In a metal layer M, a via VA or VB is used in alternating bars, and all terminals at the same via name (e.g., VA or VB) are electrically connected. As a result, capacitor 200 is seen at any two terminals at two vias VA and VB. Because capacitors $C_B$ are connected in parallel, the total capacitance C of capacitor 200 is the sum of all capacitors $C_B$, and any two vias VA and VB can serve as two terminals for capacitor 200. For illustration, a terminal at a via VA and a via VB is called a terminal A and a terminal B, respectively.

The Flip-Flop

Figure 5:
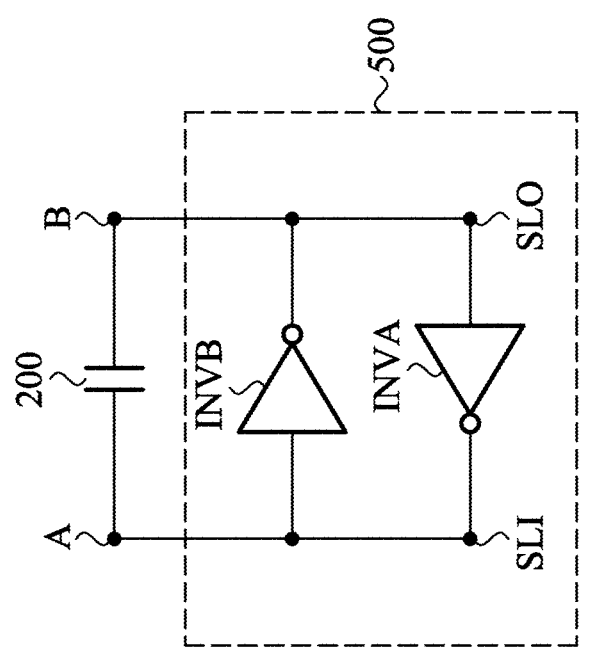
FIG. 5 is a diagram of an exemplary latch in a flip-flop being used in some embodiments.

FIG. 5 is a diagram of a circuit representation of a latch 500 coupled to a capacitor 200, in accordance with some embodiments. Latch 500 is either a master latch or a slave latch, of a flip-flop. A first end (e.g., terminal A) of capacitor 200 is coupled to an input SLI of latch 500, and a second end (e.g., terminal B) of capacitor 200 is coupled to an output SLO of latch 500. In some embodiments, latch 500 and capacitor 200 are coupled to one another through a contact metal (not shown). By having both terminals A and B of capacitor 200 coupled to both the input SLI and the output SLO, some embodiments improve radiation hardening and reduce SER by balancing the charging/and discharging at nodes SLO and SLI. For example, when input SLI is charged, because of the existence of capacitor 200, the voltage at node SLI is not increased as high as it would without capacitor 200. Further, charges (e.g., positive charges) are stored in capacitor 200 in the terminal A side. Because of the positive charges stored in the terminal A side, negative charges are generated in capacitor 200 in the terminal B side. Further, the voltage at node SLO does not decrease as much as it would without capacitor 200. In effect, capacitor 200 balances the charging/discharging at input SLI and output SLO of latch 500. As a result, some embodiments are advantageous over other approaches that use gate capacitors because gate capacitors require a power or ground node and therefore cannot be used across the input SLI and output SLO, but can only be used at one side (e.g., either input SLI or output SLO). To balance the input and output, two gate capacitors must be used, which increases costs and die size of the circuit using the gate capacitors.

In some embodiments, capacitor 200 and latch 500 are built in a same layout cell, i.e., they are adjacent to one another. With this implementation, capacitor 200 and latch 500 are easily coupled to one another (e.g., any pair of terminal A and B is coupled to input SLI and output SLO based on convenience). Further, the portion of the metal layers M that are used by capacitor 200, are vertically on top of latch 500 and are unused by capacitor 200 can be used by latch 500 and/or other devices as appropriate (e.g., for routing purposes).

In some embodiments, capacitor 200 using metal layers M directly vertically above latch 500 is fabricated. In some embodiments, latch 500 is fabricated using a base layer (e.g., base layer 110 in FIG. 1) up to metal one layer (e.g., layer M1), and capacitor 200 is fabricated using available metal layers directly vertically above metal layer M1, including for example, layers M2, M3, M4, etc. Because capacitor 200 is fabricated directly vertically on top of latch 500, some embodiments save chip areas. This is because capacitor 200 does not take up space in the area adjacent to latch 500, which would increase the total size of the base layer, which in turn increases the area of the semiconductor chip as a whole. In this aspect, some embodiments are advantageous over many other approaches (e.g., approaches that use gate capacitors) because those approaches cannot fabricate capacitors directly vertically over latch 500. Latch 500 is shown for illustration, other memory elements that use capacitor 200 for better radiation hardening, including, for example, different kinds of latches (including clock gated latches), flip-flops, etc., and are within the scope of the disclosed embodiments. Memory elements refer to semiconductor devices that can store a logic state of either a high (e.g., 1) or a low (e.g., 0).

Because some embodiments add capacitor 200 to latch 500, some embodiments add capacitance, balance charges, and reduce the chance for latch 500 to be upset (e.g., unwantedly flipped its state) and therefore reduce SER FIT rate. For example, without the added capacitor 200, it would take X amount of charges (in Coulombs) for latch 500 to flip due to radiation while with the added capacitor 200, it would take Y amount of charge to flip wherein Y is greater than X. Because of the greater amount of charge (Y being greater than X) being required for the latch to flip, the SER FIT rate decreases. In some embodiments, adding a 10 fP capacitor 200 to a flip-flop improves neutron SER FIT rate by about 100 times.

Configuring the Capacitor in Conjunction with the Semiconductor Device Using the Capacitor In some embodiments capacitor 200 is configured based on the layout size of the base layer (e.g., base layer 110) of the semiconductor device (e.g., latch 500 or flip-flop of latch 500) that uses capacitor 200. For example, in some embodiments, the layout size (e.g., the width D and length L) of capacitor 200 is determined based on the layout size of base layer 110 of latch 500 that uses capacitor 200. For a further example, the layout size of base layer 110 of latch 500 is first determined to have a width D1 and a length L1, then a width D and a length L for capacitor 200 that are equal to or smaller than the respective width D1 and length L1 are determined. Capacitor 200 is next configured. That is, the number of metal layers M to be used and the number of metal bars MB per metal layer M, subject to the determined width D and length L and the desired capacitance C is determined. The number of metal bars MB is determined based on numerous configurations of width $W_{bar}$ and distance D.

In selecting a layout area (including width D and length L) for capacitor 200, some embodiments consider various factors including leaving the available metal layers M (after being used by capacitor 200) to be used for other purposes (e.g., routing and interconnecting other resources). For example, some embodiments select the layout area in the interconnect layer 120 for capacitor 200 such that various metal bars MB can be grouped and placed near the periphery of the chip and routed to latch 500 in a way to reduce routing congestion. Placing the metal bars MB near the periphery allow the other areas available for routing, interconnecting, etc. For further example, some embodiments determine a corner area for capacitor 200 and define two routable terminals (e.g., terminal A1 and B1 that can be used by a place and route tool to connect to other components). Some embodiments also define two input SLI and output SLO as routable ports. The place and route tool, based on the provided routable terminals A1 and B1 and ports SLI and SLO, connects them together as appropriate. The above are examples, various configurations of capacitor 200, i.e., different sizes and/or areas in interconnect layer 120 are within the scope of the disclosed embodiments.

Critical Charge Qc

Critical charge Qc (or Q critical) is the minimum charge disturbance needed to change a logic level of electronic devices. Circuits with higher capacitance (and thus charges) are less likely to suffer soft errors. A higher Qc results in a lower soft error rate (SER). In some embodiments, critical charge Qc is the amount of charge asserted at an input of latch 500 (e.g., input SLI of latch 500) before the output of the flip-flop (e.g., output SLO of latch 500) flips its state, i.e., changing from a low logic to a high logic or from a high logic to a low logic. Generally, the larger the charge, the harder the latch flips, and, conversely, the smaller the charge, the easier the latch flips. Those skilled in the art will recognize that the amount of charge is proportional to the capacitance of a capacitor. That is, the larger the capacitance, the larger the amount of charge is provided by that capacitor. Conversely, the smaller the capacitance, the smaller the amount of charge is provided by that capacitor.

In some embodiments, a radiation charge injection simulation by SPICE is used to determine the critical charge Qc of latch 500. An experimental capacitor is coupled to latch 500. Critical charge Qc is determined by injecting charges to input SLI of latch 500 and observing the status change at output SLO. The critical charge Qc is obtained when the voltage level of output SLO reaches a critical level, which, in some embodiments, is 50% of its high value. For illustration purposes, input SLI is at a low logic (e.g., ground, or 0V), output SLO is at a high logic (e.g., VDD, the operation supply voltage). The positive charge is then injected at node SLI. Once the charge is injected, the voltage level at output SLO keeps decreasing from its high value down to a point when this voltage level reaches 50% of VDD, at which point critical charge Qc is obtained. For another example, input SLI is high, and output SLO is low. The negative charge is then injected at node SLI. Once the charge is injected, the voltage level at output SLO keeps increasing, and when it reaches 50% of a high, the critical charge Qc is obtained. The above SPICE simulation is then repeated for a different exemplary capacitor having a different capacitance. As a result, for each obtained critical charge Qc, there is a corresponding capacitance, e.g., capacitance Cq.

The results of various SPICE simulations are then tabulated in a table showing corresponding critical charges and capacitances, and, based on this table, the capacitance C of capacitor 200 for a particular application may be calculated. For example, critical charges Qc1, Qc2, and Qc3 are obtained at three different simulations and correspond to three different capacitance values Cq1, Cq2, and Cq3. Further, based on a predetermined SER FIT rate, a target critical charge (e.g., Qctarget) is determined. Target critical charge Qctarget is then matched against the critical charge values Qc1, Qc2, and Qc3 in the table to determine the corresponding capacitance (e.g., Cq1, Cq2, or Cq3) that is used as capacitance C for capacitor 200. Based on this capacitance C, a capacitor 200 is configured. If there is not an exact match in the table, various calculations and assumptions may be made to calculate capacitance C for capacitor 200.

Illustrative Methods

FIG. 6 is a flowchart illustrating a method for forming a mesh capacitor, in accordance with some embodiments.

In step 605, a plurality of critical charges are determined.

In step 610, a plurality of capacitances corresponding to the plurality of critical charges is determined.

In step 615, a target critical charge based on a predetermined soft error rate is determined.

In step 620, a capacitance (e.g., the target capacitance) of the plurality of capacitances in step 610 that corresponds to a critical charge matching the target critical charge is identified.

In step 625, the mesh capacitor having the target capacitance is generated. The mesh capacitor uses one or a plurality of metal layers as appropriate.

FIG. 7 is a flowchart illustrating a method for improving radiation hardening and thus improving SER of a memory element (e.g., latch 500) in accordance some embodiments.

In step 705, a mesh capacitor (e.g., capacitor 200) is formed. For illustration, mesh capacitor 200 includes a first set of conductive (e.g., metal) bars MB in metal layer M2 and a second set of conductive bars MB in metal layer M3. Vias are used to couple the conductive bars in the metal layers M2 and M3. One of the vias VA is selected as a first terminal and one of the vias VB is selected as the second terminal for mesh capacitor 200.

In step 710, latch 500 is built using the base layer 110 and the metal layer M1.

In step 715, the first terminal and the second terminal are coupled to the respective input (e.g., SLI) and output (e.g., SLO) of latch 500, which balances the charges at input SLI and output SLO that in turn improves the radiation hardening and reduces the SER of latch 500.

A number of embodiments of the invention have been described. It will nevertheless be understood that various variations and/or modifications may be made without departing from the spirit and scope of the invention. For example, a set of metal bars MB in a metal layer M (e.g., layer M2) is shown in FIG. 2 as perpendicular to a set of metal bars MB in another metal layer (e.g., layer M3), but these sets of metal bars MB are not required to be in that configuration. That is, one set of metal bars MB may run in a first direction while another set may run in a second direction wherein the first and the second directions may be parallel to one another or may be in any convenient direction. Further, numerous capacitors 200 are formed and used in different areas in interconnect layer 120, and these capacitors 200 have the same or different configurations (e.g., the number of layers M, length L, width W, the number of bars per layer, etc.), etc.

In accordance with one embodiment, a circuit includes a capacitor and a memory element. The capacitor includes a first conductive layer, a first terminal, and a second terminal. The first conductive layer includes a first plurality of bars extending along a first direction and parallel to one another, where two adjacent bars of the first plurality of bars have a first capacitance therebetween. The first terminal is coupled with a first bar of the two adjacent bars, and the second terminal is coupled with a second bar of the two adjacent bars. The memory element has an input coupled with the first terminal and an output coupled with the second terminal. The capacitor is configured to inhibit changing a logic state at the input of the memory element.

In accordance with another embodiment, a circuit includes a memory element, a first set of conductive bars over the memory element, and a second set of conductive bars over the first set of conductive bars. The memory element includes an input and an output. The first set of conductive bars extends along a first direction and includes a first subset of conductive bars and a second subset of conductive bars. The first subset of conductive bars of the first set of conductive bars is electrically coupled with the input of the memory element, and the second subset of conductive bars of the first set of conductive bars is electrically coupled with the output of the memory element. The second set of conductive bars extends along a second direction different from the first direction and includes a first subset of conductive bars and a second subset of conductive bars. The first subset of conductive bars of the second set of conductive bars is electrically coupled with the input of the memory element, and the second subset of conductive bars of the second set of conductive bars is electrically coupled with the output of the memory element.

In accordance with another embodiment, a circuit includes a capacitor and a memory element. The capacitor includes a first set of conductive bars and a second set of conductive bars extending along a first direction, a third set of conductive bars and a fourth set of conductive bars extending along a second direction, a first set of vias, and a second set of vias. The first set of conductive bars and the second set of conductive bars are alternately disposed in a first interconnection layer. The third set of conductive bars and the fourth set of conductive bars are alternately disposed in a second interconnection layer. The first set of vias electrically couples the first set of conductive bars with the third set of conductive bars. The second set of vias electrically couples the second set of conductive bars with the fourth set of conductive bars. The memory element is coupled with the capacitor, and the capacitor is configured to inhibit changing a logic state of the memory element.

The above illustrative methods show exemplary steps, but they are not necessarily performed in the order shown. Steps may be added, replaced, changed order, and/or eliminated as appropriate, in accordance with the spirit and scope of disclosed embodiments.

Each claim of this document constitutes a separate embodiment, and embodiments that combine different claims and/or different embodiments are within scope of the invention and will be apparent to those skilled in the art after reviewing this disclosure.

What is claimed is:

1. A circuit comprising:
    a capacitor comprising:
        a first conductive layer comprising a first plurality of bars and a second plurality of bars extending along a first direction and parallel to one another;
        a first plurality of first vias arranged in a first grid and coupled with the first plurality of bars; and
        a second plurality of second vias arranged in a first grid and coupled with the second plurality of bars; and
    a memory element having an input coupled with the first plurality of first vias and an output coupled with the second plurality of second vias;
    wherein the capacitor is configured to inhibit changing a logic state at the input of the memory element.

2. The circuit of claim 1, wherein the memory element comprises a flip-flop or a latch.

3. The circuit of claim 1, wherein the first plurality of bars is directly and vertically over an area occupied by the memory element.

4. The circuit of claim 1, wherein no bar of the first plurality of bars is directly and vertically over an area occupied by the memory element.

5. The circuit of claim 1, wherein the first conductive layer comprises routing and interconnecting structures.

6. The circuit of claim 1, wherein:
    the circuit is implemented in a chip arranged with an internal region and a peripheral region;
    the memory element is disposed in the internal region; and
    the first plurality of bars is disposed in the peripheral region.

7. The circuit of claim 1, wherein
    a portion of the memory element is formed at a first metal layer of a semiconductor structure; and
    the first conductive layer is one layer above the first metal layer.

8. The circuit of claim 1, wherein the memory element comprises:
    a first inverter; and
    a second inverter,
    the input of the memory element being coupled with an input of the first inverter and an output of the second inverter, and the output of the memory element being coupled with an output of the first inverter and an input of the second inverter.

9. The circuit of claim 1, wherein the capacitor further comprises:
    a second conductive layer over the first conductive layer, the second conductive layer comprising a third plurality of bars and a fourth plurality of bars extending along a second direction and parallel to one another, wherein
    the first plurality of first vias is electrically coupled with the third plurality of bars;
    the second plurality of second vias is electrically coupled with the fourth plurality of bars; and
    the first direction and the second direction are not parallel to each other.

10. The circuit of claim 9, wherein
    the first direction is perpendicular to the second direction.

11. A circuit comprising:
a memory element comprising an input and an output;
a first set of conductive bars extending along a first direction, the first set of conductive bars having a first subset of conductive bars and a second subset of conductive bars, the first subset of conductive bars of the first set of conductive bars being electrically coupled with the input of the memory element, and the second subset of conductive bars of the first set of conductive bars being electrically coupled with the output of the memory element;
a second set of conductive bars over the first set of conductive bars and extending along a second direction different from the first direction, the second set of conductive bars having a first subset of conductive bars and a second subset of conductive bars, the first subset of conductive bars of the second set of conductive bars being electrically coupled with the input of the memory element, and the second subset of conductive bars of the second set of conductive bars being electrically coupled with the output of the memory element.

12. The circuit of claim 11, wherein
a portion of the memory element is formed at a first metal layer of a semiconductor structure;
the first set of conductive bars is formed in a second metal layer; and
the second metal layer is one layer above the first metal layer.

13. The circuit of claim 11, wherein the first set of conductive bars and the second set of conductive bars are directly and vertically over an area occupied by the memory element.

14. The circuit of claim 11, wherein the memory element comprises a flip-flop or a latch.

15. The method of claim 11, wherein the first direction is perpendicular to the second direction.

16. The circuit of claim 11, wherein the memory element comprises:
a first inverter; and
a second inverter,
the input of the memory element being coupled with an input of the first inverter and an output of the second inverter, and the output of the memory element being coupled with an output of the first inverter and an input of the second inverter.

17. A circuit comprising:
a capacitor comprising:
a first set of conductive bars and a second set of conductive bars extending along a first direction and alternately disposed in a first interconnection layer;
a third set of conductive bars and a fourth set of conductive bars extending along a second direction and alternately disposed in a second interconnection layer;
a first set of vias electrically coupling the first set of conductive bars with the third set of conductive bars; and
a second set of vias electrically coupling the second set of conductive bars with the fourth set of conductive bars; and
a memory element coupled with the capacitor,
wherein the capacitor is configured to inhibit changing a logic state of the memory element.

18. The circuit of claim 17, wherein the memory element comprises:
an input electrically coupled with the first set of conductive bars and the third set of conductive bars; and
an output electrically coupled with the second set of conductive bars with the fourth set of conductive bars.

19. The circuit of claim 17, wherein the first set of conductive bars, the second set of conductive bars, the third set of conductive bars, and the fourth set of conductive bars are directly and vertically over an area occupied by the memory element.

20. The circuit of claim 17, wherein the memory element comprises a flip-flop or a latch.

* * * * *